(12) United States Patent
Tsurume et al.

(10) Patent No.: US 11,843,165 B2
(45) Date of Patent: Dec. 12, 2023

(54) VEHICULAR GLASS MODULE

(71) Applicant: NIPPON SHEET GLASS CO., LTD., Tokyo (JP)

(72) Inventors: Yoshinobu Tsurume, Toride (JP); Hiromasa Morishita, Abiko (JP); Yuta Nakano, Sendai (JP)

(73) Assignee: Nippon Sheet Glass Co., Ltd., Tokyo (JP)

( * ) Notice: Subject to any disclaimer, the term of this patent is extended or adjusted under 35 U.S.C. 154(b) by 502 days.

(21) Appl. No.: 17/277,605

(22) PCT Filed: Jul. 18, 2019

(86) PCT No.: PCT/JP2019/028237
§ 371 (c)(1),
(2) Date: Mar. 18, 2021

(87) PCT Pub. No.: WO2020/059275
PCT Pub. Date: Mar. 26, 2020

(65) Prior Publication Data
US 2021/0351498 A1 Nov. 11, 2021

(30) Foreign Application Priority Data

Sep. 19, 2018 (JP) .................................. 2018-175049

(51) Int. Cl.
*B60J 1/00* (2006.01)
*B60R 21/12* (2006.01)
(Continued)

(52) U.S. Cl.
CPC ............. *H01Q 1/325* (2013.01); *B60R 16/02* (2013.01); *H01R 12/58* (2013.01); *H01R 13/665* (2013.01);
(Continued)

(58) Field of Classification Search
CPC ........ H01Q 1/325; H01Q 1/1271; H01Q 1/32; H01Q 1/1278; B60R 16/02; H01R 12/58;
(Continued)

(56) References Cited

U.S. PATENT DOCUMENTS

| 6,307,515 | B1 | 10/2001 | Sauer et al. | |
|---|---|---|---|---|
| 7,918,682 | B2* | 4/2011 | Hirai | H01Q 1/1278 439/374 |
| 2017/0321859 | A1* | 11/2017 | Zawacki | F21S 41/29 |

FOREIGN PATENT DOCUMENTS

| JP | H03-131118 A | 6/1991 |
|---|---|---|
| JP | H04-131118 U | 12/1992 |

(Continued)

OTHER PUBLICATIONS

Office Action dated Mar. 1, 2022 issued in corresponding Chinese Patent Application No. 201980061113.3 with the English translation thereof.

(Continued)

*Primary Examiner* — Minh D A
(74) *Attorney, Agent, or Firm* — Carrier, Shende & Associates P.C.; Joseph P. Carrier; Fulchand P. Shende

(57) ABSTRACT

A vehicular glass module (1) includes a vehicular window glass (2) having a conductive pattern (4) formed thereon and an on-glass connector (3) attached to the vehicular window glass (2). The on-glass connector (3) includes a hollow portion (11) and a circuit board (6) disposed in the hollow portion (11). The hollow portion (11) is in communication with an outside of the case (5) via a through hole (15) provided in a partition wall (14) defining a part of the hollow portion (11). The through hole (15) is positioned lower than the circuit board (6). The water generated in the hollow portion (11) by condensation is discharged to the outside via the through hole (15).

10 Claims, 6 Drawing Sheets

(51) Int. Cl.
  *H01Q 1/32* (2006.01)
  *B60R 16/02* (2006.01)
  *H01R 12/58* (2011.01)
  *H01R 13/66* (2006.01)
  *H05K 5/00* (2006.01)
(52) U.S. Cl.
  CPC ....... *H05K 5/0026* (2013.01); *H01R 2201/26* (2013.01)
(58) Field of Classification Search
  CPC .............. H01R 13/665; H01R 2201/26; H05K 5/0026; H05K 5/0212
  See application file for complete search history.

(56) References Cited

FOREIGN PATENT DOCUMENTS

| | | |
|---|---|---|
| JP | 2001-313513 A | 11/2001 |
| JP | 2002-294795 A | 10/2002 |
| JP | 2007-336730 A | 12/2007 |
| JP | 2009-295109 A | 12/2009 |
| JP | 2010-182639 A | 8/2010 |
| JP | 2017-126465 A | 7/2017 |

OTHER PUBLICATIONS

Office Action dated Jul. 25, 2023 issued in a corresponding Japanese Patent Application No. 2022-179465 with the English machine translation thereof.
Extended European search report dated May 13, 2022 issued over the corresponding EP Patent Application No. 19862652.5.

* cited by examiner

VEHICULAR GLASS MODULE

TECHNICAL FIELD

The present disclosure relates to a vehicular glass module including a vehicular window glass formed with a conductive pattern and an on-glass connector attached to the vehicular window glass and electrically connecting the conductive pattern and a vehicle system to each other.

BACKGROUND ART

A conductive pattern may be provided on a surface of a vehicular window glass as a part of a vehicle system for controlling various functions to embody an antenna pattern for transmission and reception in a specific wavelength band or to detect glass break. This conductive pattern has a terminal surface for joint. An on-glass connector is disposed on a surface of the window glass to connect the conductor pattern and the vehicle system.

The on-glass connector includes a structure capable of being electrically connected to the terminal surface for joint of the conductive pattern, a structure to be fixed on the glass surface, and a structure to be connected to the vehicle system. Also, the on-glass connector may contain a circuit board on which an electric circuit having a function of adjusting the conducted electric current, voltage, and signals is mounted (for example, see Patent Document 1).

PRIOR ART DOCUMENT(S)

Patent Document(s)

[Patent Document 1] JP2001-313513A

SUMMARY OF THE INVENTION

Task to be Accomplished by the Invention

In winter, the on-glass connector is warmed by heating in the passenger compartment while being in contact with the window glass cooled by cold outside air, and therefore, condensation tends to occur. In the on-glass connector described in Patent Document 1, the case holding the circuit board therein is filled with soft resin to seal the circuit board, whereby the circuit board is protected from condensation.

However, the on-glass connector described in Patent Document 1 is electrically connected to the terminal surface for joint on the glass surface by metal solder, which also fixes the on-glass connecter to the glass surface. This joins the on-glass connector and the glass surface to each other by heating the joint portion to a high temperature. The heat generated at this time propagates through a metallic part of the joint portion and may easily melt, degrade or peel off the soft resin that seals the circuit board. This may lead to intrusion of water through the damaged part of the soft resin, and the intrusion water may damage the electronic circuit components inside.

In view of such problems, an object of the present invention is to provide a vehicular glass module having an on-glass connector in which influence of condensation on the circuit board is reduced.

Means to Accomplish the Task

At least some embodiments of the present invention provide a vehicular glass module (1) comprising a vehicular window glass (2) having a conductive pattern (4) formed thereon and an on-glass connector (3) attached to the vehicular window glass and electrically connecting the conductive pattern and a vehicle system (8) to each other, wherein the on-glass connector comprises: a case (5) including a hollow portion (11); a circuit board (6) disposed in the hollow portion; a pair of glass-side conductors (7) electrically connecting the circuit board to the conductive pattern; and a pair of system-side conductors (9) electrically connecting the circuit board to the vehicle system, and wherein a through hole (15) is provided in a partition wall (14) defining a part of the hollow portion of the case.

According to this configuration, since the through hole allows the condensed water to be discharged from the hollow portion, the influence of the condensation on the circuit board can be reduced. Unlike the structure sealing the circuit board with soft resin, this structure for discharging the condensed water via the through hole does not get influence of soldering heat. Also, since it is unnecessary to cover and seal the circuit board with soft resin, the weight of the on-glass connector can be reduced. In addition, since the electronic circuit components do not get influence of heat stress when sealed with soft resin, electronic circuit components with low heat resistance may be used. Also, the electronic circuit components do not get influence of the pressure when the soft resin flows.

At least some embodiments of the present invention are characterized by that, in the foregoing configuration, the through hole is positioned lower than a conductive part of the circuit board.

According to this configuration, not only the water that has evaporated as vapor, but also the water in the liquid state can be discharged from the hollow portion due to gravity without staying long time on the conductive part of the circuit board.

At least some embodiments of the present invention are characterized by that, in the foregoing configuration, the case has a plug receiving portion (13) into which a plug electrically connected to the vehicle system is to be inserted, the hollow portion and the plug receiving portion are respectively arranged on an upper side and a lower side in a longitudinal direction of the case, the through hole brings the hollow portion and the plug receiving portion into communication with each other, the plug receiving portion is opened on a lower side in the longitudinal direction, the longitudinal direction is substantially parallel to the vehicular window glass, and an end portion of the pair of system-side conductors disposed in the plug receiving portion extends in the longitudinal direction.

According to this configuration, the water condensed in the hollow portion is discharged to the outside of he case via the through hole and the plug receiving portion, and at the time of assembly, the plug is inserted in parallel to the surface of the vehicular window glass, whereby it is possible to prevent a load from being applied on the vehicular window glass perpendicularly thereto.

At least some embodiments of the present invention are characterized by that, in the foregoing configuration, the case has a floor portion (16) on which the circuit board is placed, the floor portion has a ridge (17), and the circuit board is placed on a tip of the ridge.

According to this configuration, the contact area between the circuit board and the floor portion is reduced, and therefore, an amount of water staying between the circuit board and the floor portion due to surface tension can be reduced.

At least some embodiments of the present invention are characterized by that, in the foregoing configuration, the ridge includes a pair of ridges so as to extend in a direction approaching and separating from the partition wall, and a groove (19) is formed between the pair of ridges and the partition wall such that a space surrounded by the pair of ridges and the circuit board is in communication with the through hole.

According to this configuration, the water condensed in the space surrounded by the pair of ridges and the circuit board is discharged via the groove.

At least some embodiments of the present invention are characterized by that, in any of the foregoing configurations in that the through hole is positioned lower than the circuit board, the case includes a main body having the partition wall and a cover that cooperates with the main body to define the hollow portion, and at least a part of a surface of the cover that opposes the circuit board is flush with a part of the inner circumferential surface that defines the through hole.

According to this configuration, since the inner surface of the cover is flush with a part of the inner circumferential surface of the through hole, the water condensed on the inner surface of the cover can be easily discharged.

At least some embodiments of the present invention are characterized by that, in any of the foregoing configurations, end portions of the pair of glass-side conductors and the pair of system-side conductors connected to the circuit board are each passed through the circuit board from a same side of the circuit board.

According to this configuration, the pair of glass-side conductors and the pair of system-side conductors can be soldered on the same side of the circuit board, so that the circuit board can be made a single-sided board.

At least some embodiments of the present invention are characterized by that, in any of the foregoing configurations, the case is made of hard resin.

According to this configuration, the cover made of hard resin protects the circuit board from an act such as picking, thereby making it possible to prevent the circuit board from being damaged.

At least some embodiments of the present invention are characterized by that, in any of the foregoing configurations, a varnish (26) is applied on a front side of the circuit board.

According to this configuration, owing to the application of the varnish, it is possible to prevent the water temporarily staying in the hollow portion from causing malfunction the circuit board such as short circuit.

Effect of the Invention

According to the present invention, in a vehicular glass module having an on-glass connector, influence of condensation on the circuit board can be reduced.

MODES FOR CARRYING OUT THE INVENTION

Figure 1:
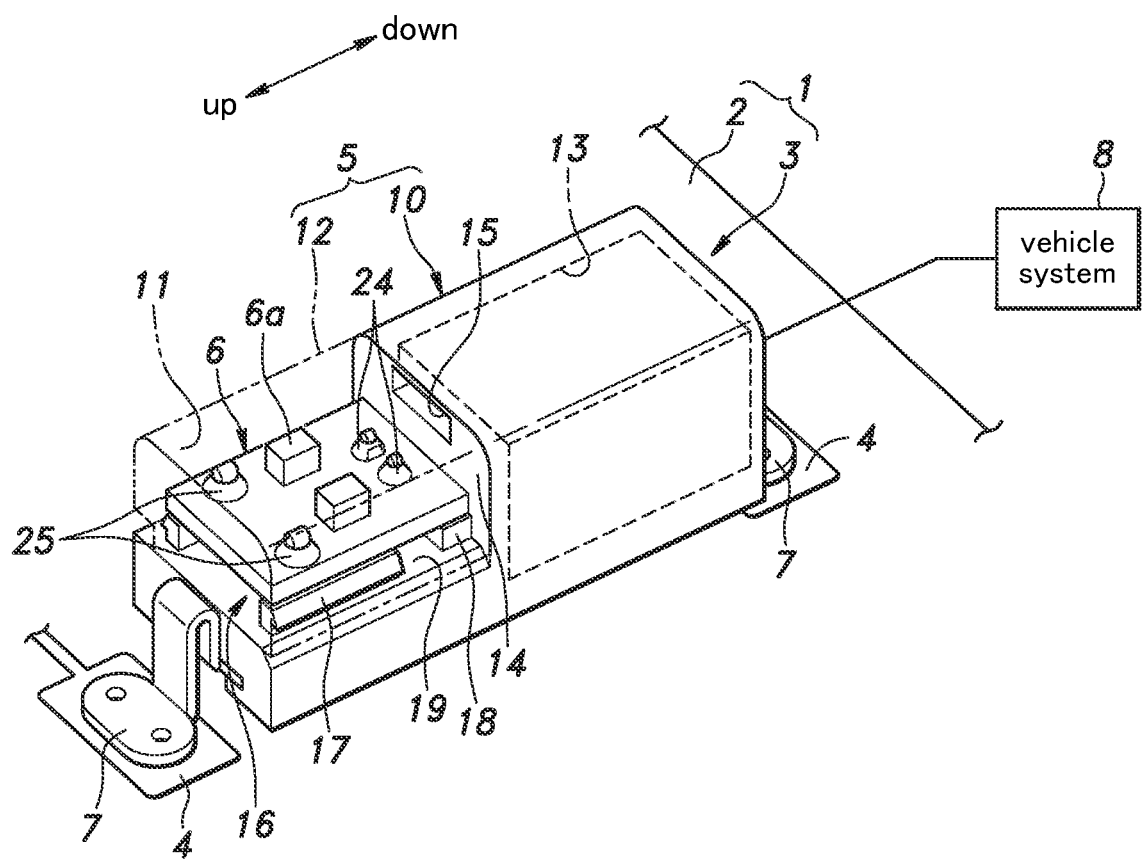
FIG. 1 is a perspective view of a part of a vehicular glass module according to an embodiment.

In the following, an embodiment of the present invention will be described with reference to the drawings. As shown in FIG. 1, a vehicular glass module 1 according to the embodiment includes a vehicular window glass 2 and an on-glass connector 3 attached to the vehicular window glass 2.

The vehicular window glass 2 may be embodied as any of a front windshield, a rear windshield, or a side windshield. The vehicular window glass 2 has a conductive pattern 4 formed thereon. The conductive pattern 4 is, for example, an antenna pattern, a pattern for detecting breaking of the vehicular window glass 2, or the like.

The on-glass connector 3 is attached to a surface of the vehicular window glass 2 inside the passenger compartment. The on-glass connector 3 includes a case 5, a circuit board 6 disposed in the case 5 and having a function of adjusting the conducted electric current, voltage, signals, etc., a pair of glass-side conductors 7, 7 electrically connecting the circuit board 6 to the conductive pattern 4, and a pair of system-side conductors 9, 9 electrically connecting the circuit board 6 to a vehicle system 8.

The case 5 is made of hard resin such as polyphenylene sulfide (PPS) resin. For example, in a case where the vehicular glass module 1 includes a security system for detecting theft by breaking the vehicular window glass 2, if the circuit on the circuit board 6 is short circuited by an act such as picking, the detection of breaking may not be performed properly. The case 5 made of hard resin can protect the circuit board 6 from an act such as picking.

Figure 2:
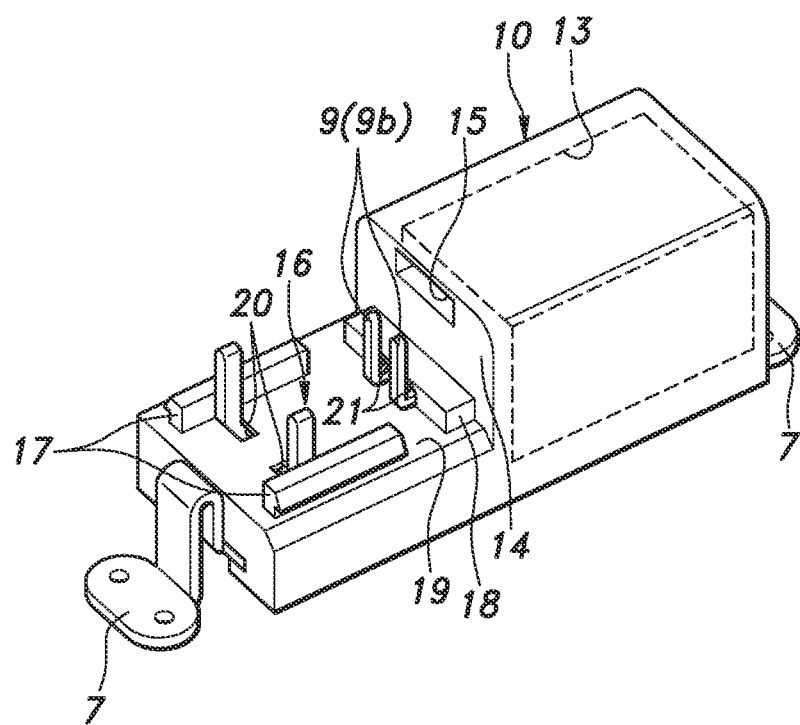
FIG. 2 is a perspective view of an on-glass connector according to the embodiment (excluding a cover and a circuit board)
Figure 3:
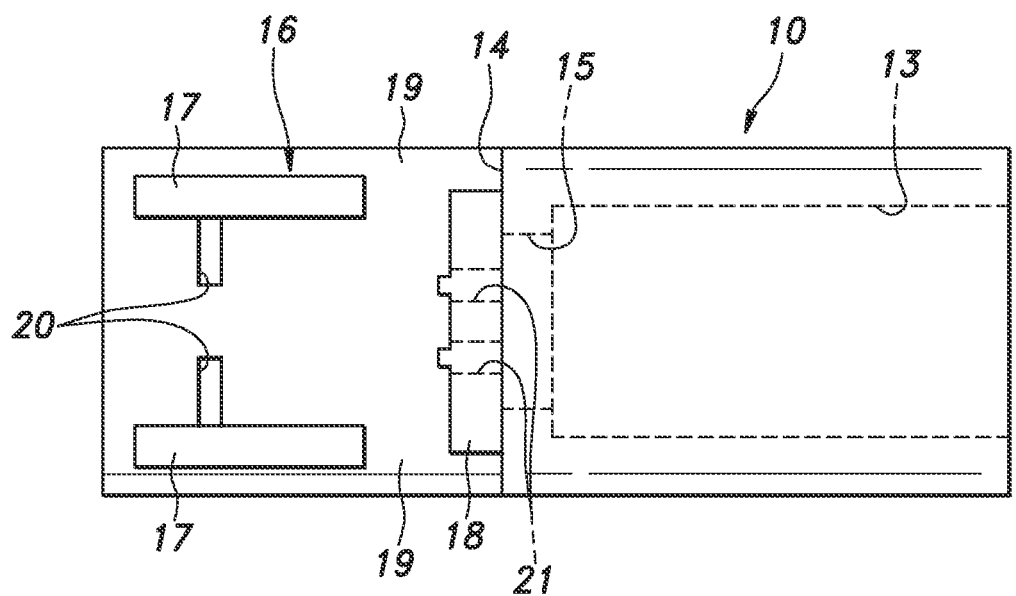
FIG. 3 is a plan view of a main body of a case of the on-glass connector according to the embodiment.

As shown in FIGS. 1 to 3, the case 5 includes a main body 10 and a cover 12 that cooperates with the main body 10 to define a hollow portion 11 in which the circuit board 6 is disposed. The case 5 is in a substantially rectangular parallelepiped shape and has a longitudinal direction substantially parallel to a surface of the vehicular window glass 2 on which the on-glass connector 3 is attached, a transverse direction substantially parallel to the surface and orthogonal to the longitudinal direction, and a thickness direction orthogonal to both the longitudinal direction and the transverse direction. The longitudinal direction may coincide with the vertical direction of the vehicle or an inclined vertical direction that is inclined in the fore and aft direction and/or in the lateral direction. Therefore, the longitudinal direction in the present embodiment is a direction in which movement is affected by gravity. The main body 10 has a shape obtained by cutting off a portion of the substantially rectangular parallelepiped case 5 located on an upper side in the longitudinal direction and on a side remote from the vehicular window glass 2 in the thickness direction (hereinafter, the side close to the vehicular window glass in the thickness direction will be simply referred to as "a proximal side" while the side remote from the vehicular window glass in the thickness direction will be simply referred to as a "distal side") along a cross section orthogonal to the longitudinal direction and a cross section orthogonal to the thickness direction. The cover 12 substantially has a shape covering the cut off portion.

The case 5 has a hollow portion 11 on the upper side in the longitudinal direction and on the distal side in the thickness direction and a plug receiving portion 13 on the lower side in the longitudinal direction, into which a plug (not shown) electrically connected to the vehicle system 8 is to be inserted. The lower side of the plug receiving portion 13 in the longitudinal direction is opened so that the plug can be inserted therein. The electrically connecting means between the plug and the vehicle system 8 is not particularly limited, and a coaxial cable may be used, for example. The plug receiving portion 13 is defined by the main body 10. The main body 10 has a partition wall 14 that partitions the hollow portion 11 and the plug receiving portion 13. The partition wall 14 is in a flat plate-like shape orthogonal to the longitudinal direction, and has a through hole 15 in a distal side portion in the thickness direction. As viewed in the longitudinal direction, the through hole 15 has a rectangular shape having long sides and short sides respectively extending in the transverse direction and the thickness direction of the case 5, for example, and extends linearly along the longitudinal direction to bring the hollow portion 11 and the plug receiving portion 13 into communication. The through hole 15 is positioned lower than the conductive part of the circuit board 6, such as circuit elements 6a and a circuit pattern (not shown), with respect to the vehicle. The water condensed in the hollow portion 11 can be discharged to the outside via the through hole 15 and the plug receiving portion 13. Also, a part of the surface of the cover 12 opposing the circuit board 6 is flush with an inner surface of the through hole 15 on the distal side in the thickness direction, whereby the flow of the condensed water from the cover 12 to the through hole 15 is facilitated. Note that the shape of the through hole 15 is not limited to rectangle; for example, the inner surface on the distal side in the thickness direction may be in an arc-like shape as viewed in the longitudinal direction, with the central part thereof swelling toward the distal side.

The main body 10 has a floor portion 16 at a position higher than the partition wall 14 in the longitudinal direction, where the floor portion 16 is a surface of the hollow portion 11 on the proximal side in the thickness direction and faces the distal side in the thickness direction. The floor portion 16 is provided with a pair of ridges 17, 17 disposed near the respective transverse edges thereof and extending along the longitudinal direction. The pair of ridges 17, 17 each have a tip consisting of a surface substantially parallel to the surface of the vehicular window glass 2, and the protruding lengths thereof in the thickness direction are equal to each other. The circuit board 6 are placed on the tips of the pair of ridges 17, 17 at the transverse edges thereof, and therefore, is disposed substantially parallel to the surface of the vehicular window glass 2. Since the circuit board 6 is made substantially parallel to the surface of the vehicular window glass 2, it is possible to reduce the thickness of the on-glass connector 3. Also, the pair of ridges 17, 17 function as guide rails when attaching the cover 12 to the main body 10 by sliding. For example, the outer surface of each of the pair of ridges 17, 17 in the transverse direction is recessed on the proximal side thereof in the thickness direction so that the ridges 17, 17 slidably engage the respective side edges of the cover 12 extending in the longitudinal direction on the proximal side thereof in the thickness direction, and the end portions of the circuit board 6 do not protrude to the outside of the pair of ridges 17, 17 in the transverse direction, whereby the pair of ridges 17, 17 function as guide rails. Note that, by applying, before the cover 12 is attached, an adhesive to the surface of at least one ridge 17 that is to slidably contact the cover 12, the cover 12 is adhered to the main body 10. Also, instead of the surface substantially parallel to the surface of the vehicular window glass 2, the tip of each of the pair of ridges 17, 17 may have a surface with irregularities to support the circuit board 6 at multiple points.

At a corner of a boundary between the partition wall 14 and the floor portion 16, a bulging part 18 that bulges from the partition wall 14 and the floor portion 16 to extend in the transverse direction and has a rectangular parallelepiped shape is formed. The bulging length of the bulging part 18 in the thickness direction is the same as the protruding length of the pair of ridges 17, 17, and an end portion of the circuit board 6 on the lower side in the longitudinal direction is placed on the bulging part 18. An end portion of the pair of ridges 17, 17 on the lower side in the longitudinal direction is positioned higher than the bulging part 18 in the longitudinal direction, the both transverse end portions of the bulging part 18 are spaced from the cover 12, and the circuit board 6 is spaced from the cover 12 and the partition wall 14. Thereby, the space covered by the circuit board 6 and the pair of ridges 17, 17 is in communication with the through hole 15 via a groove 19 defined between the end portion of the pair of ridges 17, 17 on the lower side in the longitudinal direction and the bulging part 18 and between each transverse end of the bulging part 18 and the cover 12. Therefore, the water condensed in the space covered by the circuit board 6 and the pair of ridges 17, 17 can be discharged in the liquid state to the outside via the groove 19, a gap between the partition wall 14 and the circuit board 6, the surface of the partition wall 14, the through hole 15, and the plug receiving portion 13.

Figure 4:
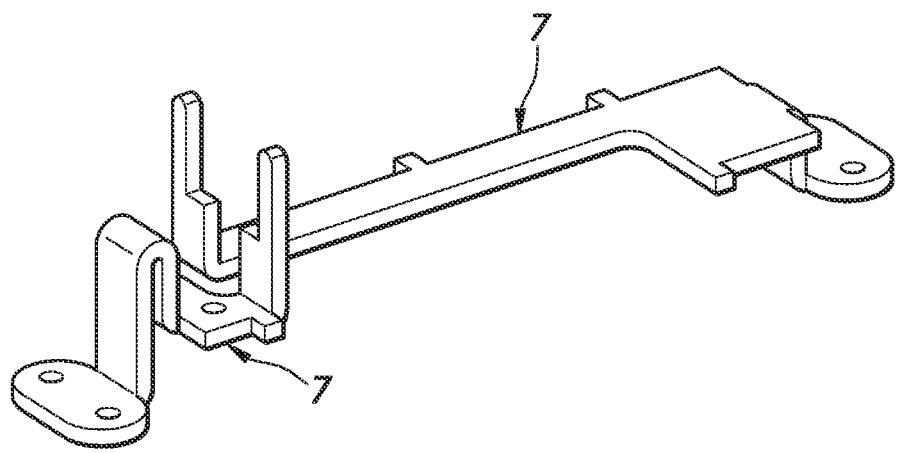
FIG. 4 is a perspective view showing a pair of glass-side conductors according to the embodiment.

As shown in FIG. 2 and FIG. 4, the pair of glass-side conductors 7, 7 each formed of a bent steel plate. One ends of the pair of glass-side conductors 7, 7 respectively extend out from the mutually opposite longitudinally end portions of the main body 10 and are fixed to and electrically connected to the conductive pattern 4 by soldering. The other ends of the pair of glass-side conductors 7, 7 are respectively inserted in first mounting holes 20 provided in the main body 10 from the surface of the main body 10 on the proximal side in the thickness direction and protrude from the floor portion 16 toward the distal side in the thickness direction to oppose each other in the transverse direction. The pair of glass-side conductors 7, 7 are fixed to the main body 10 by an adhesive or an engagement structure.

Figure 5:
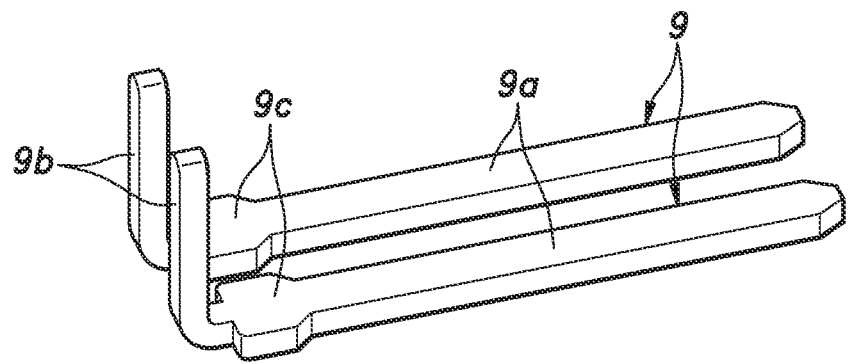
FIG. 5 is a perspective view showing a pair of system-side conductors according to the embodiment.

As shown in FIG. 2 and FIG. 5, each of the pair of system-side conductors 9, 9 consists of an L-shaped metal pin having a first part 9a extending in the longitudinal direction and a second part 9b extending in the thickness direction. One of the pair of system-side conductors 9, 9 is disposed next to the other in the transverse direction to be in parallel. The first part 9a is passed through a second mounting hole 21 provided across the bulging part 18 and the partition wall 14 from the bulging part 18, and an end portion thereof on the lower side in the longitudinal direction is disposed in the plug receiving portion 13 to be connected to the plug. The second part 9b extends out from an end portion of the first part 9a on the upper side in the longitudinal direction toward the distal side in the thickness direction. The first part 9a has a widened portion 9c that is widened in the transverse direction near the second part 9b. The pair of system-side conductors 9, 9 are fixed to the main body 10 with the respective widened portions 9c press-fitted into the corresponding second mounting holes 21. At the time of assembly, the plug is inserted into the plug receiving portion 13 along the longitudinal direction, namely, in parallel to the surface of the vehicular window glass 2, whereby it is possible to prevent a load from being applied on the vehicular window glass 2 perpendicularly thereto.

Figure 6:
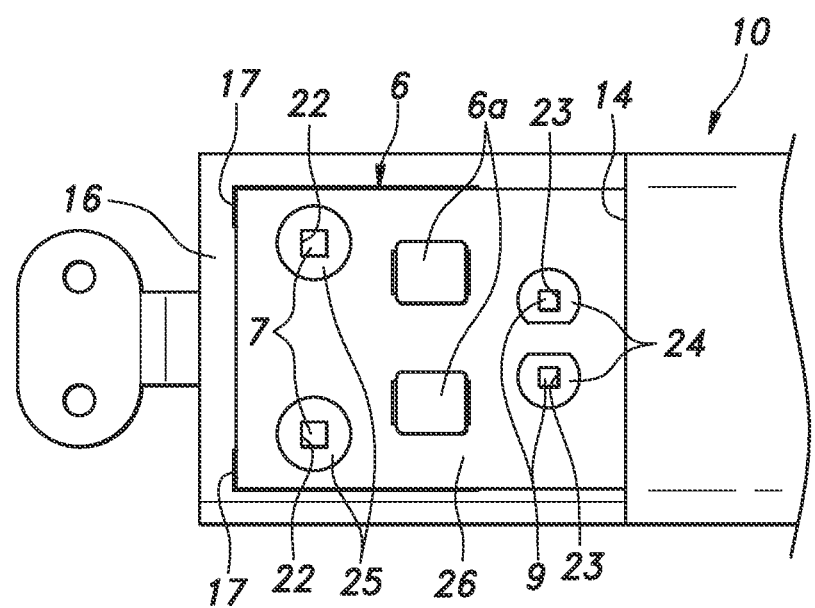
FIG. 6 is a plan view of the on-glass connector (excluding the cover) according to the embodiment.

As shown in FIG. 1 and FIG. 6, the other ends of the pair of glass-side conductors 7, 7 are respectively passed through first cut holes 22 provided in the circuit board 6 from the back side (the surface facing the proximal side in the thickness direction) of the circuit board 6 and are soldered on the front side (the surface facing the distal side in the thickness direction) of the circuit board 6. Similarly, the second parts 9*b* of the pair of system-side conductors 9, 9 are respectively passed through second cut holes 23 provided in the circuit board 6 from the back side of the circuit board 6 and are soldered on the front side (the surface facing the distal side in the thickness direction) of the circuit board 6. Thus, the circuit board 6 is fixed to the main body 10 via the pair of glass-side conductors 7, 7 and the pair of system-side conductors 9, 9. Also, since the soldering of the pair of glass-side conductors 7, 7 and the pair of system-side conductors 9, 9 on the circuit board 6 can be performed on only the front side, the circuit board 6 can be a single-sided board. Note that the circuit board 6 may be a double-sided board.

The distance between the pair of system-side conductors 9, 9 is determined by the shape of the plug and is generally narrower than the distance between the pair of glass-side conductors 7, 7. By making the distance between soldering parts 24 for soldering the second parts 9*b* of the pair of system-side conductors 9, 9 to the circuit board 6 substantially equal to the distance between the pair of system-side conductors 9, 9, each of the pair of system-side conductors 9, 9 can have a simple shape such as an L-shape. If the first part 9*a* were bent in the middle, the insertion of the first part 9*a* would become difficult when fixing it to the main body 10 and the second part 9*b* is short and is difficult to bend in the middle, and therefore, it is preferred that each of the pair of system-side conductors 9, 9 is in an L-shape. Also, the distance between the soldering parts 24 is shorter than the distance between soldering parts 25 for soldering the pair of glass-side conductors 7, 7 to the circuit board. Therefore, to prevent a circuit failure due to whiskers generated by soldering, the soldering parts 24 for soldering the second parts 9*b* to the circuit board 6 each assume a D-shape as viewed in the thickness direction, where the respective D-shapes are formed by cutting mutually facing sides of circles.

As shown in FIG. 1, FIG. 2, FIG. 5, and FIG. 6, the force applied to the pair of system-side conductors 9, 9 due to insertion of the plug is distributed to the partition wall 14 and the bulging part 18 into which the widened portions 9*c* are press-fitted as well as to the circuit board 6, and the force transmitted to the circuit board 6 acts in a direction parallel to the surface of the circuit board. Therefore, the load on the circuit pattern (not shown) and/or the circuit elements 6*a* on the circuit board 6 is considerably reduced.

Since the water condensed in the hollow portion 11 temporarily stays in the hollow portion 11, a varnish 26 may be applied on the surface of the circuit board 6 on which the circuit pattern and the circuit elements 6*a* are mounted. Thereby, malfunction such as short circuit can be prevented more reliably.

The vehicular glass module 1 provides the following effects regarding condensation. Since the hollow portion 11 is in communication with the outside of the case 5 via the through hole 15, the water condensed in the hollow portion 11 can be discharged. Further, since the through hole 15 is positioned lower than the hollow portion 11, particularly, lower than the conductive part of the circuit board 6, not only the water that has evaporated as vapor is discharged, but also the water in the liquid state is discharged due to gravity.

The circuit board 6 is supported by the pair of ridges 17, 17 and the bulging part 18 arranged at a right angle to the pair of ridges 17, 17, whereby the contact area between the circuit board 6 and the floor portion 16 is made small. Therefore, an amount of water surface staying between them due to tension can be reduced. In addition, the groove 19 allows the water condensed in the space surrounded by the circuit board 6, the pair of ridges 17, 17, and the bulging part 18 to be discharged.

In this way, although the condensed water may temporarily stay in the hollow portion 11, the water is discharged to the outside of the case 5, and therefore, it is possible to protect the circuit board 6 without filling the hollow portion 11 with soft resin, and the weight of the on-glass connector 3 can be reduced. By applying the varnish 26 on the circuit board 6, the circuit board 6 is protected from the temporarily staying water. Also, compared to the conventional technology in which the hollow portion 11 is filled with soft resin, the electronic circuit components of the circuit board 6 do not get influence of heat stress when sealing with the soft resin, and therefore, electronic circuit components with low heat resistance may be used. Also, the electronic circuit components do not get influence of the pressure when the soft resin flows.

A concrete embodiment of the present invention has been described in the foregoing. However, as will be readily appreciated by a person of ordinary skill in the art, the present invention may be practiced in various ways without being limited to the embodiment or a modified embodiment. The number and arrangement of the ridges may be changed. For example, another ridge may be provided between the pair of ridges in parallel, or a ridge parallel to the bulging part may be provided near the upper ends of the ridges extending in the longitudinal direction. The entire contents of the patent application based on which the present application claims the Paris Convention priority and the conventional technology referred to in the present description are herein incorporated by reference.

GLOSSARY

1: vehicular glass module
2: vehicular window glass
3: on-glass connector
5: case
6: circuit board
7: glass-side conductor
9: system-side conductor
10: main body
11: hollow portion
12: cover
13: plug receiving portion
14: partition wall
15: through hole
16: floor portion
17: ridge
18: bulging part
19: groove
26: varnish

The invention claimed is:

1. A vehicular glass module comprising a vehicular window glass having a conductive pattern formed thereon and an on-glass connector attached to the vehicular window glass and electrically connecting the conductive pattern and a vehicle system to each other, wherein the on-glass connector comprises:

a case including a hollow portion;

a circuit board disposed in the hollow portion;

a pair of glass-side conductors electrically connecting the circuit board to the conductive pattern; and a pair of system-side conductors electrically connecting the circuit board to the vehicle system, and wherein a through hole is provided in a partition wall defining a part of the hollow portion of the case.

2. The vehicular glass module as defined in claim 1, wherein the through hole is positioned lower than a conductive part of the circuit board.

3. The vehicular glass module as defined in claim 2, wherein the case has a plug receiving portion into which a plug electrically connected to the vehicle system is to be inserted, the hollow portion and the plug receiving portion are respectively arranged on an upper side and a lower side in a longitudinal direction of the case, the through hole brings the hollow portion and the plug receiving portion into communication with each other, the plug receiving portion is opened on a lower side in the longitudinal direction, the longitudinal direction is substantially parallel to the vehicular window glass, and an end portion of the pair of system-side conductors disposed in the plug receiving portion extends in the longitudinal direction.

4. The vehicular glass module as defined in claim 3, wherein the case has a floor portion on which the circuit board is placed, the floor portion has a ridge, and the circuit board is placed on a tip of the ridge.

5. The vehicular glass module as defined in claim 2, wherein the case has a floor portion on which the circuit board is placed, the floor portion has a ridge, and the circuit board is placed on a tip of the ridge.

6. The vehicular glass module as defined in claim 5, wherein the ridge includes a pair of ridges so as to extend in a direction approaching and separating from the partition wall, and a groove is formed between the pair of ridges and the partition wall such that a space surrounded by the pair of ridges and the circuit board is in communication with the through hole.

7. The vehicular glass module as defined in claim 2, wherein the case includes a main body having the partition wall and a cover that cooperates with the main body to define the hollow portion, and at least a part of a surface of the cover that opposes the circuit board is flush with a part of the inner circumferential surface that defines the through hole.

8. The vehicular glass module as defined in claim 1, wherein end portions of the pair of glass-side conductors and the pair of system-side conductors connected to the circuit board are each passed through the circuit board from a same side of the circuit board.

9. The vehicular glass module as defined in claim 1, wherein the case is made of hard resin.

10. The vehicular glass module as defined in claim 1, wherein a varnish is applied on a front side of the circuit board.

* * * * *